(12) United States Patent
Coriasso et al.

(10) Patent No.: US 7,548,574 B2
(45) Date of Patent: Jun. 16, 2009

(54) INTEGRATED MODULATOR/LASER ASSEMBLY AND A METHOD OF PRODUCING SAME

(75) Inventors: Claudio Coriasso, Leiní (IT); Rui Yu Fang, Turin (IT); Guido Roggero, Cirié (IT); Marzia Rosso, Rivalta di Torino (IT); Simone Codato, Cirié (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 13 days.

(21) Appl. No.: 11/153,672

(22) Filed: Jun. 15, 2005

(65) Prior Publication Data
US 2006/0078014 A1    Apr. 13, 2006

(30) Foreign Application Priority Data
Oct. 8, 2004    (GB) ................. 0422311.1

(51) Int. Cl.
*H01S 3/08*    (2006.01)
*H01S 3/113*    (2006.01)
(52) U.S. Cl. ........................... 372/99; 372/11
(58) Field of Classification Search ............ 372/26, 372/50.1, 50.11, 50.23, 45.01, 96, 11, 18
See application file for complete search history.

(56) References Cited

U.S. PATENT DOCUMENTS

| | | | | |
|---|---|---|---|---|
| 4,958,355 | A * | 9/1990 | Alphonse et al. | 372/45.01 |
| 5,978,400 | A * | 11/1999 | Campbell et al. | 372/46.01 |
| 6,108,481 | A * | 8/2000 | Tohyama et al. | 385/131 |
| 6,391,671 | B2 * | 5/2002 | Inomoto et al. | 438/41 |
| 6,411,763 | B1 * | 6/2002 | Sillard et al. | 385/129 |
| 6,542,533 | B1 * | 4/2003 | Parayanthal | 372/64 |
| 6,593,602 | B2 * | 7/2003 | Liang et al. | 257/189 |
| 6,804,281 | B1 * | 10/2004 | Walpole et al. | 372/45.01 |
| 7,142,343 | B2 * | 11/2006 | Kim et al. | 359/245 |
| 2002/0061153 | A1 * | 5/2002 | Sillard et al. | 385/14 |
| 2004/0066806 | A1 * | 4/2004 | Deacon | 372/20 |
| 2005/0185264 | A1 * | 8/2005 | Shin et al. | 359/344 |
| 2005/0201675 | A1 * | 9/2005 | Knopp et al. | 385/27 |

FOREIGN PATENT DOCUMENTS

| | | |
|---|---|---|
| GB | 36040766 | 10/2004 |
| WO | 01/13479 | 2/2001 |

\* cited by examiner

*Primary Examiner*—Minsun Harvey
*Assistant Examiner*—Joshua King

(57) ABSTRACT

An laser/modulator assembly includes a laser source, such as a distributed feedback (DFB) laser, and a modulator, such as an electro-absorption modulator (EAM), integrated along a common waveguide. The waveguide has a distal end bent to define an inner side of the bent waveguide. A low reflectivity facet is arranged at the distal end of the waveguide, and a mirror is arranged at the inner side of the distal end of the waveguide to prevent any back reflection into the EAM waveguide from said low reflectivity facet, and the lateral trenches typically associated therewith.

11 Claims, 3 Drawing Sheets

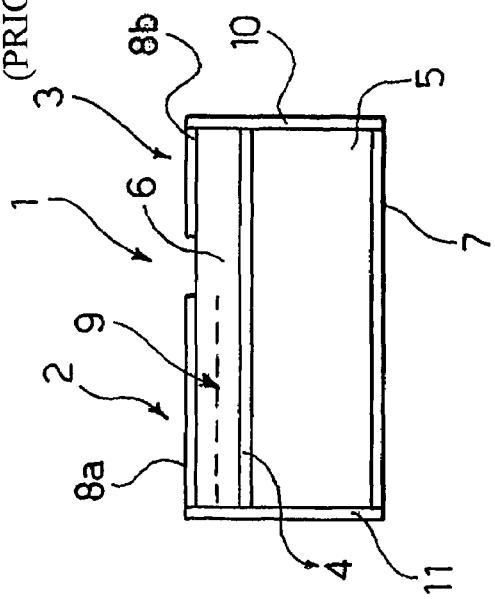
Fig. 2 (PRIOR ART)
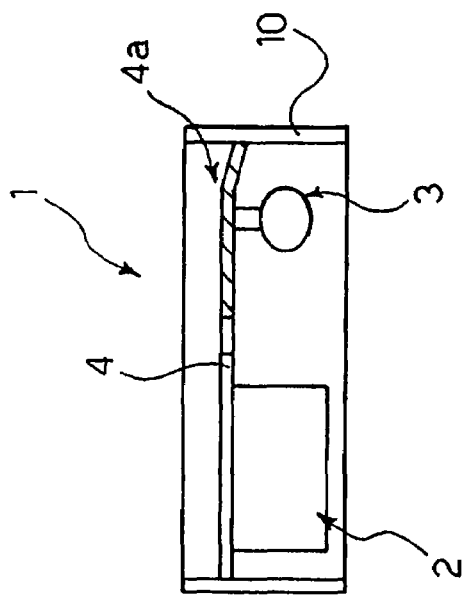
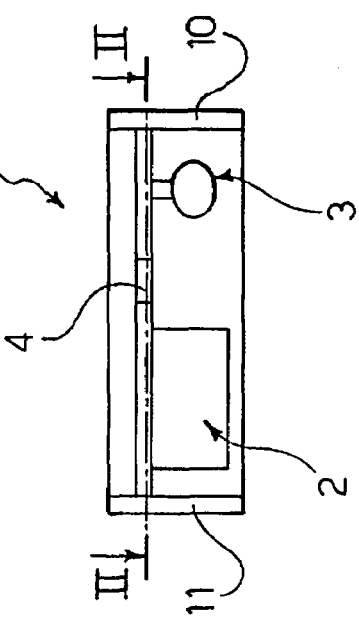
Fig. 1 (PRIOR ART)
Fig. 3 (PRIOR ART)

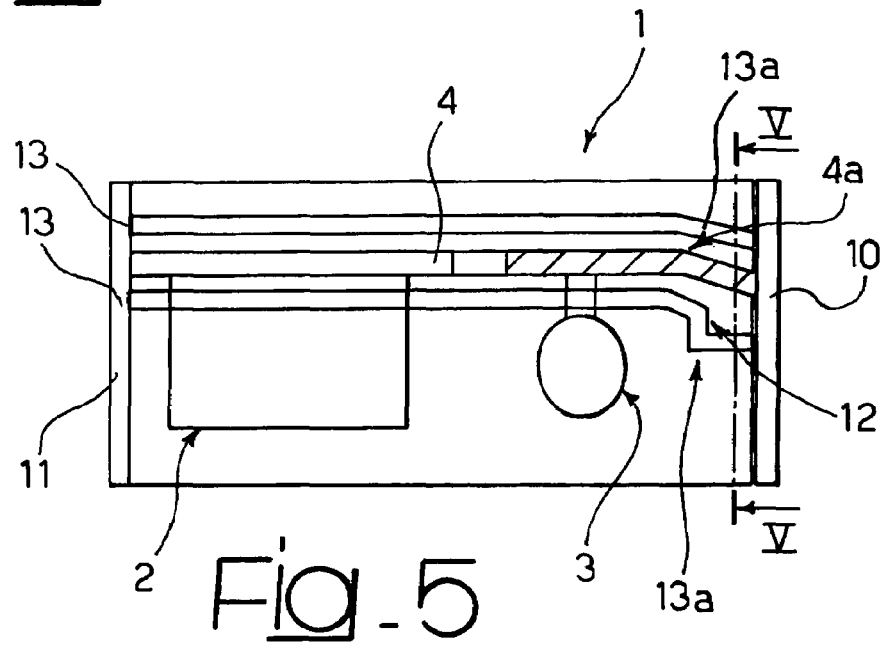
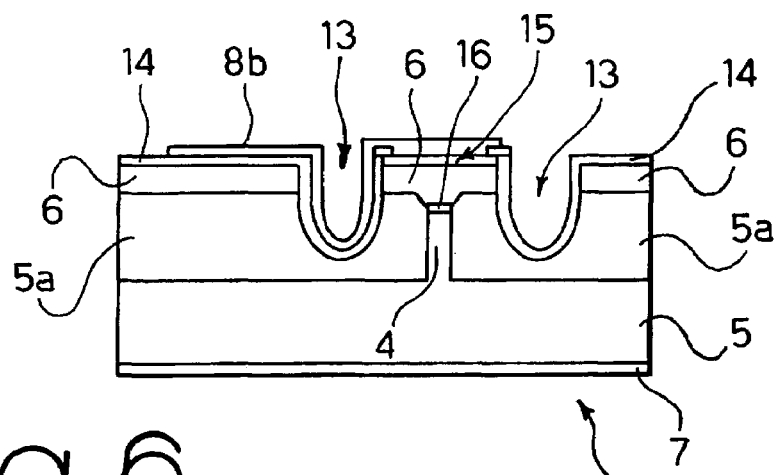
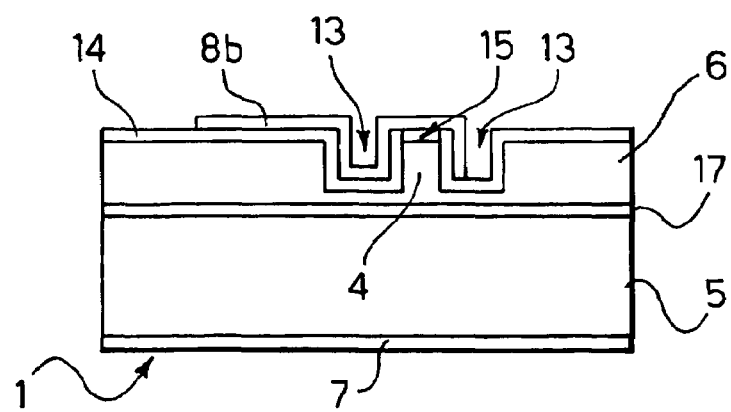

INTEGRATED MODULATOR/LASER ASSEMBLY AND A METHOD OF PRODUCING SAME

CROSS-REFERENCE TO RELATED APPLICATION

This application claims the benefit of the priority of Great Britain Patent Application No. 0422311.1 filed on Oct. 8, 2004, which is hereby incorporated by reference in its entirety.

1. Field of the Invention

The present invention relates to integrated modulator/laser assemblies, such as e.g. those assemblies including an electro-absorption modulator (EAM) integrated with a distributed feedback laser (DFB).

2. Discussion of the Background Art

Assemblies including a low-chirp 1550 nm electro-absorption modulator integrated with a distributed feedback laser (EA-DFB) have been considered for use in 10-40 km fiber optic links for 10 Gb Ethernet and 40-80 km OC192 applications.

Within these possible contexts of use, frequency chirp due to back-reflection from the modulator facet severely limits the propagation span at 10 Gb/s. Minimizing the modulator facet reflection is thus a key issue in increasing the propagation span.

FIGS. 1 and 2 show a conventional EA-DFB assembly including a straight uniform waveguide and low reflectivity facet coating. Specifically, FIGS. 1 and 2 are a top plan view of such an assembly and a cross sectional view along line II-II of FIG. 1, respectively.

The EA-DFB assembly in question, designated 1 as a whole, is shown to comprise a distributed feedback laser 2 and an electro-absorption modulator 3 cascaded along a common waveguide 4. The cross sectional view of FIG. 2 highlights the presence of a multi-quantum well (MQW) structure interposed between n-InP and p-InP semiconductor layers 5 and 6, respectively. These have associated outer n-metal and p-metal coatings 7 and 8a, 8b respectively. The p-metal layer 8a extends in correspondence with the DFB laser 2, while the p-metal layer 8b extends in correspondence with the EAM. The DFB laser section 2 includes the grating layer 9.

Finally, references 10 and 11 indicate the end facets of the assembly. These are subject to an anti-reflective treatment (facet 10) and a high reflective treatment (facet 11).

In order to operate properly, such an arrangement with a straight uniform waveguide requires a very low reflectivity value at face 10. This requirement is very close or beyond the technical limits of most film deposition kits currently available, which leads to a low fabrication yield for EA-DFB assemblies of the type shown in FIG. 1.

The requirements in terms of facet reflectivity value for the facet 10 can be somehow relaxed by resorting to a so-called "bent-waveguide" arrangement as shown in FIG. 3.

Specifically, in the prior art arrangement of FIG. 3, the distal end portion 4a of the waveguide in the EAM section 3 adjacent to the facet 10 is bent (usually with an "adiabatic" shape) in order to minimize the radiation losses.

For transmission bit rates of 10 Gb/s or higher, a very low capacitance structure is mandatory. This in turn requires a shorter length of the modulator 3 and a narrower mesa structure. This is usually achieved by creating a pair of trenches at the sides of the mesa structure. In that case, the radiation field that is back-reflected from the modulator facet can be further reflected from the sidewalls of the trenches and thus re-coupled into the laser cavity. This again undesirably increases the frequency chirp.

The need is therefore felt for an improved arrangement that overcomes the intrinsic drawbacks of the prior art arrangements discussed in the foregoing.

The object of the present invention is to satisfy such a need.

SUMMARY OF THE INVENTION

According to the present invention, that objects is achieved by means of an assembly having the features specifically set forth in the claims that follow, such a claims constituting a integral part of the disclosure of the invention. The invention also relates to a related method of manufacture.

A preferred embodiment of the invention is an assembly including a laser source, such as a distributed feedback laser (DFB), integrated with a modulator, such as an electro-absorption modulator (EAM), having a common waveguide. The waveguide in the EAM section (EAM waveguide) has a distal end, which is bent and defines an inner side of the bent waveguide. A low reflectivity facet is arranged at the distal end of the EAM section. A mirror is arranged at the inner side of the distal end of the EAM waveguide to prevent any back reflection into the EAM waveguide from the low reflectivity facet and the two lateral trenches typically associated therewith: these two trenches extending at the sides of the common waveguide, and have respective bent distal ends extending at the sides of the bent distal end of the common waveguide. The mirror is preferably provided as a step formed in the trench arranged at the inner side of the distal end of the waveguide.

In preferred embodiments, the two trenches extend down into a semi-insulating semiconductor layer providing a semi-insulating structure for the common waveguide or jointly define a ridge structure laterally confining the common waveguide.

BRIEF DESCRIPTION OF THE DRAWINGS

The invention will now be described, by way of example only, by referring to the annexed figures of drawing, wherein:

FIGS. 1 to 3 have already been described in the foregoing,

FIG. 4 represents, by direct comparison with FIG. 3, an exemplary embodiment of the invention, FIGS. 5 and 6 are cross sectional views along line V-V of FIG. 4 and related to two possible alternative embodiments of the invention.

DETAILED DESCRIPTION OF THE PREFERRED EMBODIMENT

Figure 7:
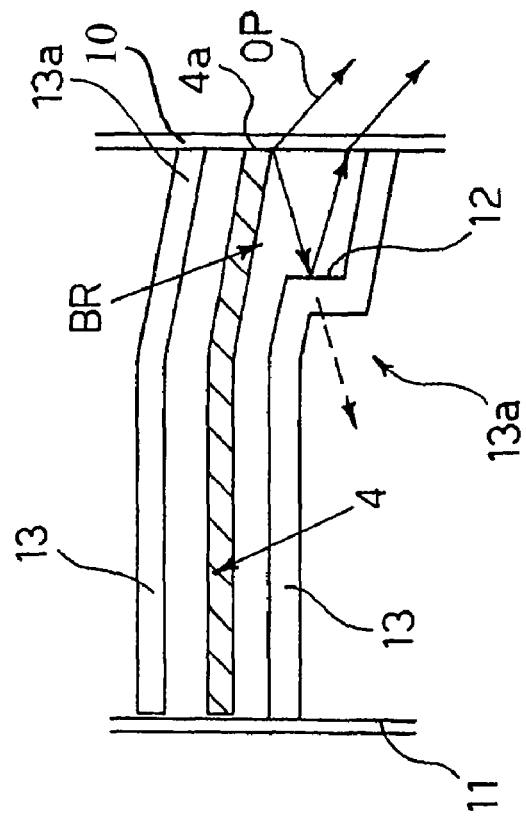
FIGS. 7 and 8 are schematic views useful in explaining operation of the arrangement of the invention.

Throughout FIGS. 4 to 8, the same reference numerals introduced in FIGS. 1 to 3 have been used to designate parts/elements that are identical or equivalent to those already described in connection with FIGS. 1 to 3. Therefore, such parts/elements will not be described again in connection with FIGS. 4 to 8. Additionally, some parts or elements that are not essential for understanding and/or reproducing the invention have been omitted from some of FIGS. 4 to 8.

Essentially, in the arrangement shown in FIGS. 4 to 6, the bent-waveguide arrangement in the modulator section 3 of the EA-DFB assembly includes a micro mirror 12. The mirror 12 provides a low back-coupled reflection level while allowing (bent) trenches to be provided at the sides of the waveguide 4.

As explained, the bent-waveguide arrangement relaxes the requirements for the low reflectivity coating of the facet 10. The trenches provide a low capacitance with a narrow mesa structure. Finally, the micro mirror 12 prevents any back reflection into the EAM waveguide possibly coming from the inner sidewalls of the trenches.

In that way, a conventional film deposition kit can meet the needs for coating the facet 10, thus improving the fabrication yield and reducing production cost.

Specifically, in FIG. 4, reference numerals 13 indicate two trenches provided (by resorting to known trench technology) at the sides of the waveguide 4. As better highlighted in FIGS. 5 and 6, the trenches 13 can be provided both with a semi-insulating structure and with a ridge (or similar) lateral structure.

In FIG. 5, the n-InP layer 5 is shown having superposed thereon a semi-insulating InP layer 5a. The trenches 13 extend down through the whole thickness of the p-InP layer 6 and partially into the semi-insulating In-P layer 5a, thus producing a semi-insulating buried heterostructure. Reference 14 designates a current SiO2 insulating layer that covers the structure just described (including the surfaces of the trenches 13) and having superposed thereon the metal layer 8b.

In the arrangement shown in FIG. 5, the mesa structure of the waveguide 4 extends from the n-InP layer up to the p-InP layer 6 while a p-InGaAs contact layer 15 is provided immediately under the p-metal layer 8b in the region between the trenches 13. In FIG. 5, reference numeral 16 indicates the MQW layer: those skill in the art will promptly appreciate that this EAM structure, taken per se, is a standard structure well known in the art, thus making it unnecessary to provide a more detailed description herein.

In FIG. 6, reference 15 indicates a p-InGaAs contact layer provided in the same position immediately above the channel 4. Still in FIG. 6, reference numeral 17 indicates the MQW layer.

Referring back to the arrangement shown in FIG. 4, both trenches 13 have distal ends bent following the bent shape of the distal end 4a of the EAM waveguide. As schematically shown in FIG. 7, such an arrangement per se would not prevent the radiation field BR back-reflected by the facet 10 from being back-coupled into the EAM waveguide. Conversely, the provision of the micro mirror 12 prevents such back-reflected radiation field BR from being coupled into the EAM waveguide 4.

Figure 8:
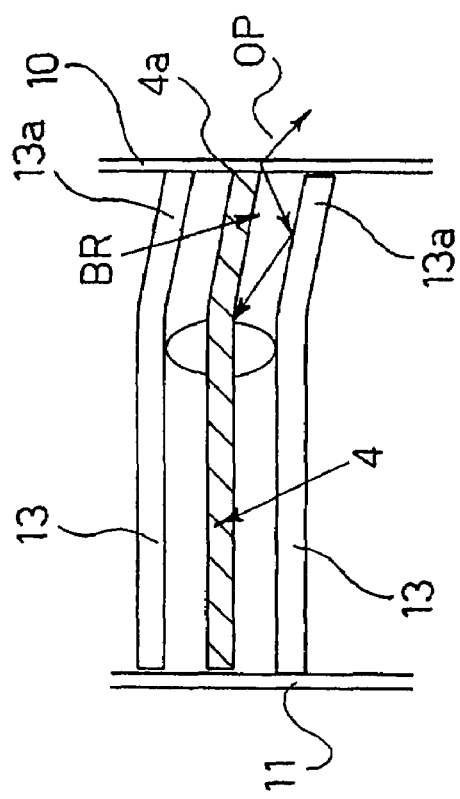

In both representations of FIGS. 7 and 8 reference OP indicates the "useful" power emitted from the assembly.

The micro mirror 12 is essentially provided in the form of a "step" in the trench (more specifically, at the bent distal end 13a thereof), which lies at the inner side of the bent portion 4a of the waveguide 4.

The term "inner side" is used herein to designate that side of the waveguide 4 where the notional centre of curvature of the bent portion 4a lies.

Stated otherwise, with reference to the representations of FIGS. 4, 7 and 8 (and FIG. 3 as well) such an "inner" side lies below the waveguide 4, while the trench 13 shown in FIGS. 4, 7 and 8 above the waveguide 4 would lay at the "outer" side of the bent waveguide.

The reflective surface of the mirror 12 is simply defined by the trench edge. This is a semiconductor-air interface with a high refractive index step. Only a partial reflection occurs at the mirror surface; however, the residual light transmitted through the mirror cannot be re-coupled into the EAM waveguide 4 as shown in FIG. 8, and thus does not contribute appreciably to increasing the undesirable chirp.

Of course, without prejudice to the underlying principle of the invention, the details and embodiments may vary, also significantly, with respect to what has been described and shown, by way of example only, without departing from the scope of the invention as defined by the annexed claims. Specifically, those of skill in the art will appreciate that terms such as "optical", "light", and the like are evidently used herein with the meaning currently allotted to those terms in fiber and integrated optics, being thus intended to apply, in addition to visible light, also e.g. to radiation in the infrared and ultraviolet ranges.

What is claimed is:

1. An assembly comprising:
    a laser source integrated with a modulator along a common waveguide, said waveguide having a distal end being bent to define an inner side of said waveguide;
    a low reflectivity facet arranged at said distal end; and
    a mirror arranged adjacent to said inner side and separate from said waveguide to reflect light from said low reflectivity facet back toward said low reflectivity facet, and thus prevent back reflection into said waveguide from said low reflectivity facet.

2. The assembly of claim 1, further comprising two trenches extending at sides of said waveguide, wherein said mirror also prevents back reflection into said waveguide from said trenches.

3. The assembly of claim 2, wherein said two trenches have respective bent distal ends extending at sides of said distal end of said waveguide.

4. The assembly of claim 2, wherein said mirror is provided as a step of one of said two trenches arranged at said inner side of said distal end of said waveguide.

5. The assembly of claim 4, wherein said mirror has a reflective surface defined by a trench edge.

6. The assembly of claim 1, wherein said mirror has a reflective surface defined by a semiconductor-air interface with a high refractive index step.

7. The assembly of claim 1, wherein said laser source is a distributed feedback laser.

8. The assembly of claim 1, wherein said modulator is an electro-absorption modulator.

9. The assembly of claim 2, wherein said two trenches extend down into a semi-insulating semiconductor layer providing a semi-insulating buried heterostructure for said waveguide.

10. The assembly of claim 2, wherein said two trenches jointly define a ridge structure laterally confining said waveguide.

11. A method of producing an assembly including a laser source integrated with a modulator, the method comprising:
    integrating said laser source with said modulator along a common waveguide, wherein said waveguide has a distal end being bent to define an inner side of said waveguide;
    arranging a low reflectivity facet at said distal end; and
        arranging a mirror adjacent to said inner side and separate from said waveguide to reflect light from said low reflectivity facet back toward said low reflectivity facet, and thus
        prevent back reflection into said waveguide from said low reflectivity facet.

* * * * *